United States Patent
Choi

(10) Patent No.: US 9,786,867 B2
(45) Date of Patent: Oct. 10, 2017

(54) METHOD OF MANUFACTURING AN ORGANIC LIGHT EMITTING DISPLAY INCLUDING A MAGNETIC PARTICLE ON A FIRST ELECTRODE

(71) Applicant: SAMSUNG DISPLAY CO., LTD., Yongin-si, Gyeonggi-Do (KR)

(72) Inventor: Sung Jin Choi, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/000,956

(22) Filed: Jan. 19, 2016

(65) Prior Publication Data

US 2016/0260922 A1  Sep. 8, 2016

(30) Foreign Application Priority Data

Mar. 2, 2015  (KR) .................. 10-2015-0029334

(51) Int. Cl.
*H01L 51/50* (2006.01)
*H01L 51/52* (2006.01)
*H01L 51/00* (2006.01)

(52) U.S. Cl.
CPC ...... *H01L 51/5228* (2013.01); *H01L 51/0014* (2013.01)

(58) Field of Classification Search
CPC ... H01L 51/50; H01L 21/0231; H01L 21/268; H01L 21/428
See application file for complete search history.

(56) References Cited

U.S. PATENT DOCUMENTS

2014/0147950 A1*  5/2014  Choi .................. H01L 51/0005
                                                            438/46

FOREIGN PATENT DOCUMENTS

| JP | 2009-302025 A | 12/2009 |
| KR | 10-2010-0010750 A | 2/2010 |
| KR | 10-2010-0051485 A | 5/2010 |
| KR | 10-2013-0071823 A | 7/2013 |

* cited by examiner

*Primary Examiner* — Hoai V Pham
(74) *Attorney, Agent, or Firm* — Lee & Morse, P.C.

(57) ABSTRACT

A method for manufacturing an organic light emitting display device that includes a gate electrode, a source electrode, and a drain electrode in a display area of a display substrate, and an organic light emitting display device, the method including forming an auxiliary electrode in a non-display area of the display substrate; forming a first electrode that is electrically connected with the drain electrode and the auxiliary electrode; providing a magnetic particle on the first electrode in the non-display area of the display substrate, the magnetic particle being carried in an organic material; fixing the magnetic particle to the first electrode using a first electromagnet; removing the organic material; forming an organic light emitting material on the first electrode and the magnetic particle; removing the magnetic particle and the organic light emitting material formed on the magnetic particle using a second electromagnet provided at a distance from the magnetic particle; and forming a second electrode on the first electrode and the organic light emitting material.

13 Claims, 10 Drawing Sheets

METHOD OF MANUFACTURING AN ORGANIC LIGHT EMITTING DISPLAY INCLUDING A MAGNETIC PARTICLE ON A FIRST ELECTRODE

CROSS-REFERENCE TO RELATED APPLICATION

Korean Patent Application No. 10-2015-0029334, filed on Mar. 2, 2015, in the Korean Intellectual Property Office, and entitled: "Organic Light Emitting Diode Display and Method of Manufacturing the Same," is incorporated by reference herein in its entirety.

BACKGROUND

1. Field

Embodiments relate to an organic light emitting display device and a method of manufacturing the same.

2. Description of the Related Art

For realization of a large-scaled organic emitting display device, a driving voltage may be reduced by maximizing a reduction of cathode resistance. In general, a cathode of a top emissive display device may help increase light emission efficiency by increasing transparence of a deposited thin metal.

The above information disclosed in this Background section is only to enhance the understanding of the background of the invention, and therefore it may contain information that does not form the prior art that is already known in this country to a person of ordinary skill in the art.

SUMMARY

Embodiments are directed to an organic light emitting display device and a method of manufacturing the same.

The embodiments may be realized by providing a method for manufacturing an organic light emitting display device that includes a gate electrode, a source electrode, and a drain electrode in a display area of a display substrate, the method including forming an auxiliary electrode in a non-display area of the display substrate; forming a first electrode that is electrically connected with the drain electrode and the auxiliary electrode; providing a magnetic particle on the first electrode in the non-display area of the display substrate, the magnetic particle being carried in an organic material; fixing the magnetic particle to the first electrode using a first electromagnet; removing the organic material; forming an organic light emitting material on the first electrode and the magnetic particle; removing the magnetic particle and the organic light emitting material formed on the magnetic particle using a second electromagnet provided at a distance from the magnetic particle; and forming a second electrode on the first electrode and the organic light emitting material.

Forming the second electrode may include directly contacting the second electrode with the first electrode in the non-display area.

Forming the auxiliary electrode may include forming the auxiliary electrode on a same layer as the gate electrode.

Forming the auxiliary electrode may include forming the auxiliary electrode on a same layer as the source electrode and the drain electrode.

Providing the magnetic particle may include supplying the magnetic particle on the first electrode by performing a one drop filling process or a printing process.

The magnetic particle may have an amorphous shape, a circular shape, a cylindrical shape, a circular cylinder shape, an oval shape, a conical shape, or a polygonal shape.

Providing the magnetic particle may include disposing the magnetic particle in one or two locations on the first electrode of the non-display area of the display substrate.

Providing the magnetic particle may include disposing one or two magnetic particles on the first electrode.

The magnetic particle may have a polarity.

The first electromagnet may have a variable polarity.

The first electromagnet may selectively apply a magnetic force.

The first electromagnet may have a plate shape.

Providing the magnetic particle may include moving the magnetic particle on the first electrode using a movable third electromagnet having a bar shape.

The embodiments may be realized by providing an organic light emitting display device including a thin film transistor in a display area of a display substrate, the thin film transistor being formed in each pixel and including a source electrode, a drain electrode, and a gate electrode; a first electrode on the thin film transistor, the first electrode being electrically connected to the thin film transistor; an organic emission layer on the first electrode; a second electrode on the organic emission layer; and an auxiliary electrode in the non-display area of the display substrate, wherein the auxiliary electrode electrically contacts the first electrode through a contact hole in the non-display area, and the first electrode electrically contacts the second electrode in the non-display area.

The auxiliary electrode may be on a same layer as the gate electrode.

The auxiliary electrode may be on a same layer as the source electrode and the drain electrode.

The embodiments may be realized by providing an organic light emitting display device prepared according to the method of an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
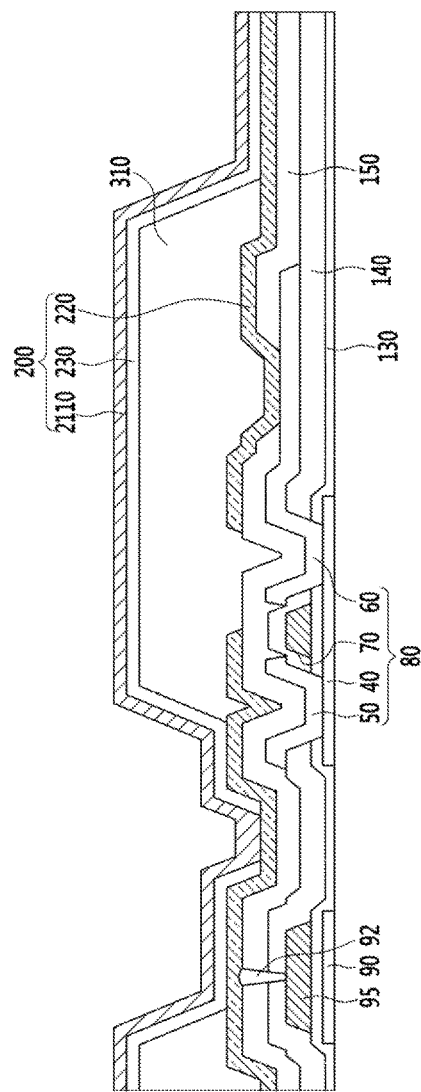
FIG. 1 illustrates a cross-sectional view of an organic light emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening elements may also be present. In addition, it will also be understood that when an element is referred to as being "between" two elements, it can be the only element between the two elements, or one or more intervening elements may also be present. Like reference numerals refer to like elements throughout.

When one part is said to be "over" or "above" another part, the one part may be directly over the other part or may be accompanied by another part interposed therebetween.

Hereinafter, an organic light emitting display device according to an exemplary embodiment will be described with reference to FIG. 1.

FIG. 1 illustrates a schematic cross-sectional view of an organic light emitting display device according to an exemplary embodiment.

Referring to FIG. 1, an organic light emitting display device may include a thin film transistor 80 and an organic light emitting element 200 in a display area of a display substrate.

The organic light emitting element 200 may include a first electrode 220 provided above, on, or overlying at least a portion of the thin film transistor 80, an organic emission layer 230 on the first electrode 220, and a second electrode 240 on the organic emission layer 230. In an implementation, the first electrode 220 may be an anode (i.e., a positive (+) electrode), which is a hole injection electrode, and the second electrode 240 may be a cathode (i.e., a negative (−) electrode), which is an electron injection electrode. Holes and electrons may be respectively injected into the organic emission layer 230 from the first electrode 220 and the second electrode 240. An exciton generated by coupling the injected hole and electron may fall from an excited state to a ground state such that light is emitted.

A pixel defining layer 310 (including an opening that exposes the first electrode 220) may be on the display substrate. A spacer may be on the pixel defining layer 310 in a non-display area of the display substrate.

The display substrate may be formed of an insulating substrate that is made of, e.g., glass, quartz, ceramic, plastic, and the like. In an implementation, the display substrate may be formed of, e.g., a metallic substrate that is made of stainless steel.

A buffer layer that helps prevent permeation of an impurity element and flatten the surface may be on the display substrate. A semiconductor layer 40 may be on the buffer layer. The semiconductor layer 40 may be formed of a polysilicon layer. In addition, the semiconductor layer 40 may include a channel area in which impurities are not doped, and a source area and a drain area in which p+ impurities are doped at respective sides of the channel area. In this case, the doped ion materials may be P-type impurities, such as boron (B). In an implementation, $B_2H_6$ may be used. In an implementation, the impurities may vary according to a kind of thin film transistor 80.

In an implementation, a PMOS structure thin film transistor 80 using P-type impurity may be used as the thin film transistor 80. In an implementation, an NMOS structure as well as a CMOS structure thin film transistor may both be used as the thin film transistor. In an implementation, the thin film transistor 80 may be a polysilicon thin film transistor including a polysilicon layer.

A gate insulating layer 130 made of, e.g., silicon nitride ($SiN_x$) or (silicon oxide $SiO_2$), may be on the semiconductor layer 40. Gate wires including a gate electrode 70 may be on the gate insulating layer 130. In an implementation, the gate electrode 70 may overlap at least a part of the semiconductor layer 40, e.g., the channel area of the semiconductor layer 40.

An interlayer insulating layer 1110 covering the gate electrode 70 may be on the gate insulating layer 130. The gate insulating layer 130 and the interlayer insulating layer 1110 may include through-holes respectively exposing the source area and the drain area of the semiconductor layer 40. In an implementation, the interlayer insulating layer 1110 may be made of or include, e.g., a ceramic-based material such as silicon nitride ($SiN_x$) or silicon oxide ($SiO_2$).

Data wires including a source electrode 50 and a drain electrode 60 may be on the interlayer insulating layer 1110. In an implementation, the source electrode 50 and the drain electrode 60 may be connected with the source area and the drain area of the semiconductor layer 40 through the through-holes in the interlayer insulating layer 1110 and the gate insulating layer 130.

As such, a thin film transistor 80 including the semiconductor layer 40, the gate electrode 70, the source electrode 50, and the drain electrode 60 may be provided or formed. In an implementation, the configuration of the thin film transistor 80 may be variously and/or suitably modified.

A planarization layer 150 covering the data wire may be on the interlayer insulating layer 1110. The planarization layer 150 may remove, reduce, and/or planarize a step in order to increase emission efficiency of the organic light emitting element to be formed thereon. In an implementation, the planarization layer 150 may include an electrode contact hole that partially exposes the drain electrode 60.

The planarization layer 150 may be made of or include, e.g., polyacrylates resin, epoxy resin, phenolic resin, polyamide resin, polyimide resin, unsaturated polyester resin, poly phenylenether resin, poly phenylenesulfide resin, or benzocyclobutene (BCB).

In an implementation, one of the planarization layer 150 and the interlayer insulating layer 1110 may be omitted.

The first electrode 220 of the organic light emitting element 200 may be on the planarization layer 150. For example, the organic light emitting display device 100 may include a plurality of first electrodes 220 respectively provided in the plurality of pixels. In this case, the plurality of first electrodes 220 may be disposed or spaced apart at a distance from each other. The first electrode 220 may be connected with the drain electrode 60 through the electrode contact hole of the planarization layer 150.

The pixel defining layer 310 (including an opening that exposes the first electrode 220) may be on the planarization layer 150. For example, the pixel defining layer 310 may include a plurality of openings formed in the respective pixels. In an implementation, the first electrodes 220 may be arranged corresponding to the openings of the pixel defining layer 310. In an implementation, the first electrodes 220 may not be arranged only in the openings of the pixel defining layer 310, and the first electrode 220 may be included below the pixel defining layer 310 so as to be partially overlapped with or underlying the pixel defining layer 310. The pixel defining layer 310 may be made of, e.g., a resin, such as a polyacrylate resin and polyimide, or a silica-based inorganic material.

An organic emission layer 230 may be on the first electrode 220, and a second electrode 240 may be on the organic emission layer 230. As such, the organic light emitting element 200 including the first electrodes 220, the organic emission layer 230, and the second electrode 240 may be provided or formed.

The organic emission layer 230 may be made of or include a low-molecular material or a high-molecular material. In an implementation, the organic emission layer 230 may be a multilayer including an emission layer, and may further include one or more of a hole injection layer (HIL), a hole transporting layer (HTL), an electron transporting layer (ETL), and an electron injection layer (EIL). In the case where the organic emission layer 220 includes all of the layers, the hole injection layer (HIL) may be on the anode 191, which is an anode, and the hole transporting layer (HTL), the emission layer, the electron transporting layer (ETL), the electron injection layer (EIL) may be sequentially laminated thereon.

The organic emission layer 230 may be provided not only in the first electrode 220 in the opening of the pixel defining layer 310 but may also be between the pixel defining layer 310 and the second electrode 240. For example, the organic emission layer 230 may further include layers such as a hole injection layer HIL, a hole transport layer HTL, an electron transport layer ETL, and an electron injection layer EIL together with an emission layer. In this case, like the second electrode 240, the above-stated layers, excluding the emission layer, may be formed not only on the first electrode 220 but also on the pixel defining layer 310 using an open mask during a manufacturing process. For example, one or more layers among the above-stated layers included in the organic emission layer 230 may be disposed between the pixel defining layer 310 and the second electrode 240.

The first electrode 220 and the second electrode 240 may be respectively made of a transparent conductive material or a transflective or reflective conductive material. According to the type of materials forming the first electrode 220 and the second electrode 240, the organic light emitting display device may be a top emission type, a bottom emission type, or a double-sided emission type.

The transparent conductive material may include, e.g., indium tin oxide (ITO), indium zinc oxide (IZO), zinc oxide (ZnO), or indium oxide ($In_2O_3$). In an implementation, lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective or transflective material.

In an implementation, an auxiliary electrode 95 (made of a same material as the gate electrode 70 of the thin film transistor 80) may be in a non-display area of the display substrate. A contact hole 92 may be in the interlayer insulating layer 1110 and the planarization layer 150 on the auxiliary electrode 95, and the first electrode 220 may be in or on the contact hole 92. The first electrode 220 may be electrically connected with the auxiliary electrode 95 through the contact hole 92. In an implementation, a part of the first electrode 220 in the non-display area may directly contact the second electrode 240, and thus may be electrically connected thereto. In an implementation, the auxiliary electrode 95 may be in or on a same layer as the gate electrode 70, e.g., the auxiliary electrode 95 may have a surface coplanar with the gate electrode 70. In an implementation, the auxiliary electrode 95 may be in or on a same layer as the source electrode 50 and the drain electrode 60, e.g., the auxiliary electrode 95 may have a surface coplanar with the source electrode 50 and/or the drain electrode 60.

The second electrode 240 may have low resistance with a structure in which the auxiliary electrode 95 is included in the non-display area of the display substrate and the first electrode 220 (electrically connected with the auxiliary electrode 95 through the contact hole 92) and the second electrode 240 (on the first electrode 220) directly contact each other.

Hereinafter, a method for forming a structure in which the first electrode 220 and the second electrode 240 are directly connected will be described.

Figure 2:
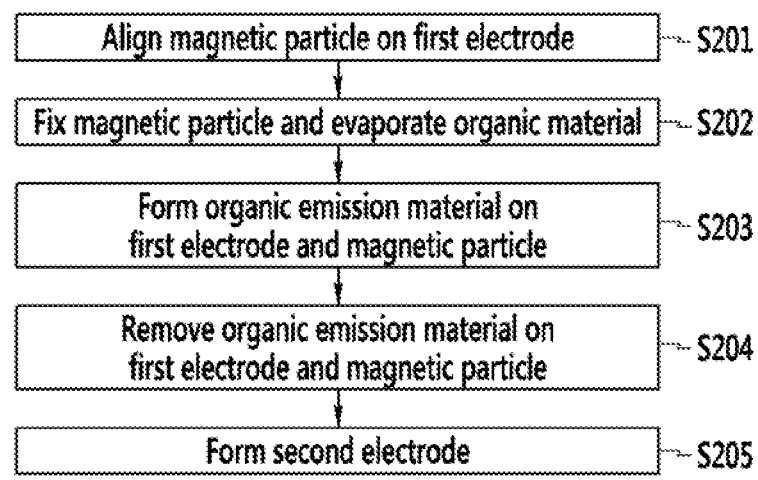
FIG. 2 illustrates a flowchart of a manufacturing method of an organic light emitting display device according to the exemplary embodiment.

FIG. 2 illustrates a flowchart of a manufacturing method of an organic light emitting display device according to an exemplary embodiment. FIG. 3A to FIG. 3G illustrate cross-sectional views of stages in the manufacturing method of the organic light emitting display device according to the exemplary embodiment.

Hereinafter, a method for manufacturing the organic light emitting display device that includes the thin film transistor 80 in the display area of the display substrate, the first electrode 220 electrically connected with the thin film transistor 80, the organic emission layer 230 on the first electrode 220, the second electrode 240 on the organic emission layer 230, and the auxiliary electrode 95 in the non-display area of the display substrate and electrically connected with the first electrode 220 through the contact hole 92, will be described.

First, the thin film transistor 80 including the gate electrode 70, the source electrode 50, and the drain electrode 60 may be formed in the display area of the display substrate. In addition, the auxiliary electrode 95 may be formed in the non-display area of the display substrate on the same layer as the gate electrode 70. The first electrode 220 (electrically connected with the drain electrode 60 and the auxiliary electrode 95) may be formed.

In an implementation, the auxiliary electrode 95 may be formed on the same layer as, e.g., coplanar with, the gate electrode 70 of the thin film transistor 80, or the auxiliary electrode 95 may be formed on a same layer as, e.g., coplanar with the source electrode 50 and the drain electrode 60.

Figure 3A:
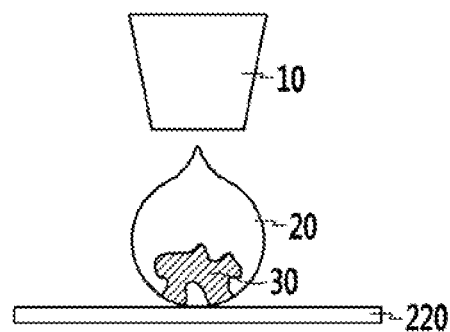
FIG. 3A to FIG. 3G illustrate cross-sectional views of stages in the manufacturing method of the organic light emitting display device according to the exemplary embodiment.
Figure 3B:
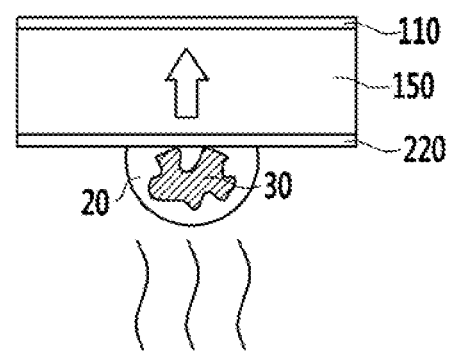
Figure 3C:
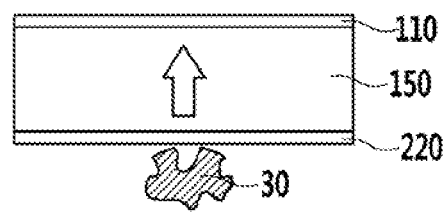

Next, a magnetic particle 30 including or carried in an organic material 20 may be provided on the first electrode 220 at the non-display area of the display substrate (S201, FIG. 3A).

The magnetic particle 30 may be supplied on the first electrode 220 using, e.g., a one drop filling (ODF) process or a printing process. The magnetic particle 30 may be in a liquid state by being mixed with, dispersed in, or otherwise carried by the organic material 20. The ODF process, which is called a liquid crystal dripping process, is a method for moving a dispenser 10 or a stage to make a given amount of liquid dripped to the substrate with a constant pattern while dotting the amount of liquid to the substrate. As an example of the printing process, an inkjet printing method, a gravure printing method, a gravure offset printing method, a screen printing method, and the like may be used.

Next, the magnetic particle 30 (mixed with or carried in the organic material 20) may be fixed to the first electrode 220 using a first electromagnet 110. The, the organic material 20 may be vaporized (S202, FIG. 3B and FIG. 3C), e.g., the liquid may be removed. The first electrode 220 may be on the planarization layer 150, and the first electromagnet 110 may be on the planarization layer 150 such that the magnetic particle 30 may be fixed by the magnetic force of the first electromagnet 110. The magnetic force or field of the first electromagnet 110 may be amplified (e.g., turned on) or blocked (e.g., turned off) by selective application of current. For example, a magnetic force or field may be selectively applied by the first electromagnet 110. In an implementation, the first electromagnet 110 may have a plate shape. The organic material 20 included in or carrying the magnetic particle 30 may be vaporized using heat or light such that the organic material 30 may be separated or removed from the magnetic particle 30.

Figure 3D:
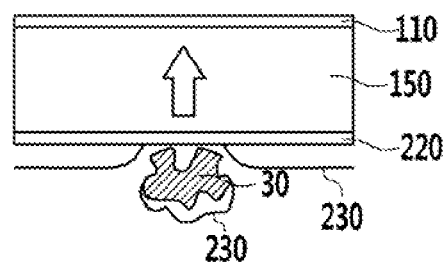

Next, an organic light emitting material 230 may be formed or provided on the first electrode 220 and the magnetic particle 30 (S203, FIG. 3D). In the case that the organic material 20 mixed with or carrying the magnetic particle 30 is removed, the organic light emitting material 230 may be simultaneously formed in the magnetic particle 30 and the first electrode 220. The magnetic particle 30 may remain fixed to the first electrode 220 by the first electromagnet 110.

Figure 3E:
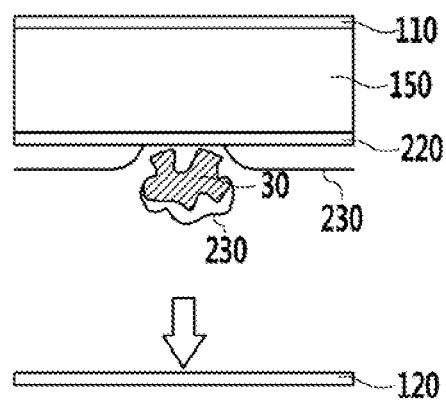
Figure 3F:
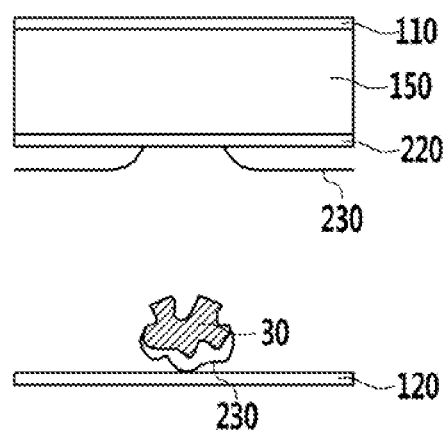

Next, the magnetic particle 30 may be removed using a second electromagnet 120 provided at a distance or spaced apart from the magnetic particle 30 (S204, FIG. 3E and FIG. 3F). A magnetic force or field of the second electromagnet 120 may be greater than the magnetic force or field of the first electromagnet 110 (that fixes the magnetic particle 30 to the first electrode 220). As the magnetic particle 30 is removed by the second electromagnet 120, the organic light emitting material 230 that was formed or deposited on the magnetic particle 30 may also be removed. As a result, a portion of the first electrode 220 where the magnetic particle 30 had been fixed may be exposed to the outside, e.g., may not be covered by the organic light emitting material 230, because a portion of the organic light emitting material 230 may be removed along with the magnetic particle 30.

Figure 3G:
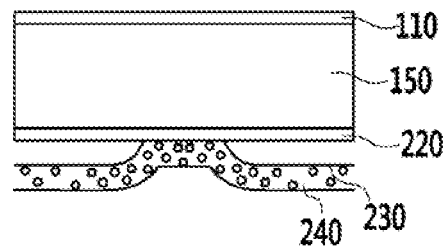

Next, the second electrode 240 may be formed on the exposed first electrode 220 and the organic light emitting material 230 (S205, FIG. 3G). Accordingly, the first electrode 220 and the second electrode 240 may directly contact each other in the portion where the magnetic particle 220 had been disposed and then removed.

FIG. 4A to FIG. 4G illustrate cross-sectional views of stages a method for manufacturing an organic light emitting display device according to another exemplary embodiment.

Unlike the previously-described exemplary embodiment, in the present exemplary embodiment, a magnetic particle 30 may have an elongated shape, e.g., may be formed in the shape of a many-sided column, having a polarity, and the magnetic particle 30 may be disposed on the first electrode 220 and fixed thereto using an electromagnet 110 having a variable polarity. Other than this difference, the previous exemplary embodiment and the present exemplary embodiment are the same in constituent elements and processes. The magnetic particle 30 formed in, e.g., the many-sided column shape, may have a polarity of N-pole and S-pole. For example, the magnetic particle 30 formed in, e.g., the many-sided column shape, may be divided into two portions, and one of the two portions may have an N-pole and the other may have an S-pole. The magnetic particle 30 may have, e.g., an amorphous shape, a circle or circular shape, a cylindrical shape, a circular cylinder shape, an oval shape, a conical shape, or a polygonal shape.

Figure 4A:
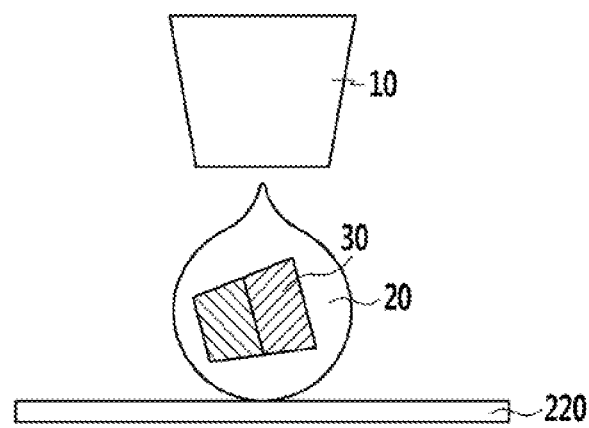
FIG. 4A to FIG. 4G illustrate cross-sectional views of stages in a manufacturing method of an organic light emitting display device according to another exemplary embodiment.

First, the, e.g., many-sided column shape, magnetic particle 30 including or carried in an organic material 20 may be provided or deposited on the first electrode 220 in a non-display area of the display substrate (FIG. 4A). As in the previous exemplary embodiment, the magnetic particle 30 may be supplied on the first electrode 220 using, e.g., an ODF process or a printing process.

Figure 4B:
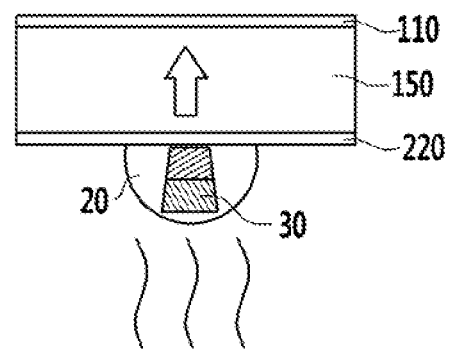
Figure 4C:
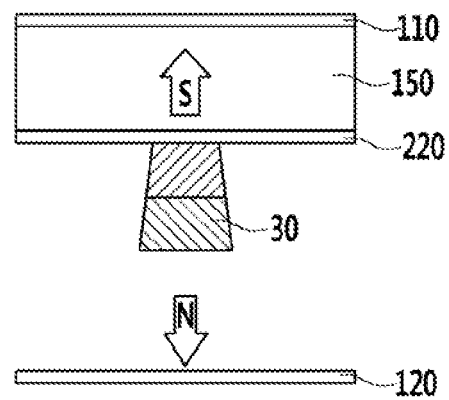

Next, the magnetic particle 30 carried in the organic material 20 may be fixed to the first electrode 220 using a first electromagnet 110. Then, the organic material 20 may be separated and/or removed from the magnetic particle 30 by, e.g., vaporizing the organic material 20 using heat or light (FIG. 4B). The first electromagnet 110 may have a plate shape, and the magnetic particle 30 may be aligned by another electromagnet, e.g., a second electromagnet 120 (FIG. 4C).

Figure 4D:
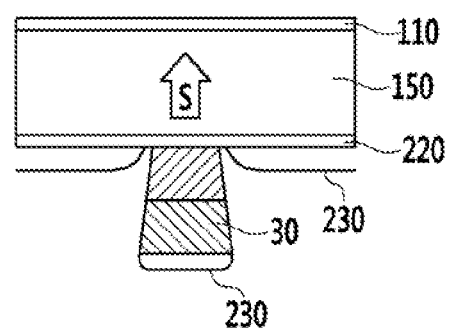
Figure 4E:
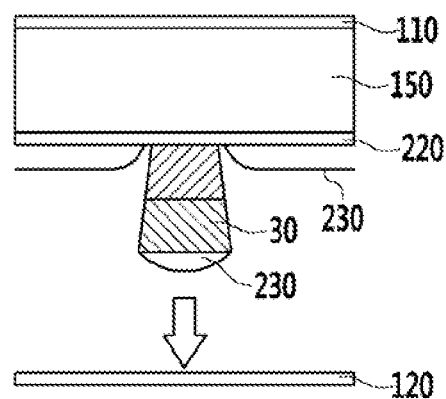
Figure 4F:
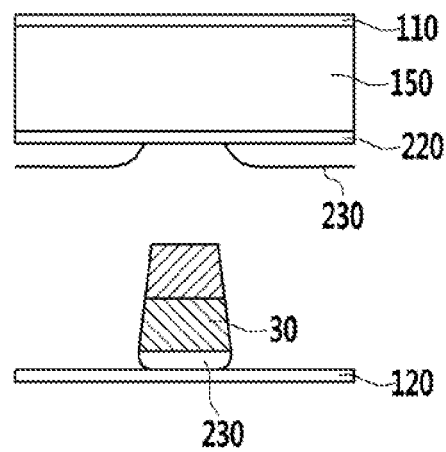
Figure 4G:
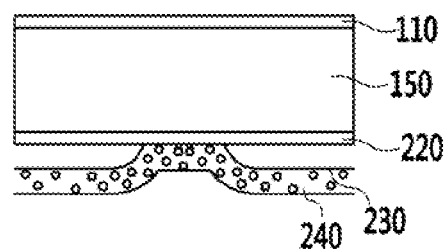

Next, an organic light emitting material 230 may be formed or deposited on the first electrode 220 and the magnetic particle 30 (FIG. 4D). The, the magnetic particle 30 and the organic light emitting material 230 on the magnetic particle 30 may be removed using the second electromagnet 120 provided at a distance or spaced apart from the magnetic particle 30 (FIG. 4E and FIG. 4F).

Next, a second electrode 240 may be formed on the exposed first electrode 220 and the organic light emitting material 230 (FIG. 4G) such that the first electrode 220 and the second electrode 240 directly contact each other in a portion or region where the magnetic particle 30 had been disposed and then removed.

In an implementation, the magnetic particle 30 may be disposed in one or two locations on the first electrode 220 in the non-display area of the display substrate, and one or more magnetic particles 30 may be provided on the first electrode 220.

Figure 5:
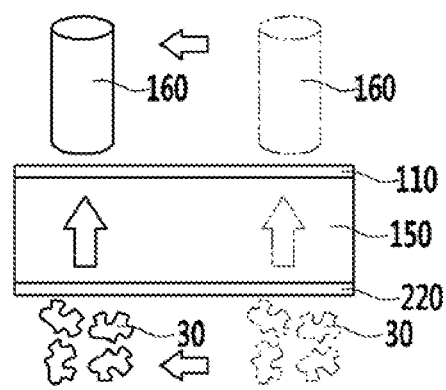
FIG. 5 illustrates a schematic cross-sectional view of a magnetic particle alignment method according to another exemplary embodiment.

FIG. 5 illustrates a schematic cross-sectional view of a magnetic particle alignment method according to another exemplary embodiment. The present exemplary embodiment is the same as the previous two exemplary embodiments in the process sequence and configuration, except that a magnetic particle 30 may be moved on a first electrode 220 additionally using a third electromagnet 160 (formed in the shape of a bar) that is movably provided at an outside of the plate-shaped first electromagnet 110, and therefore no further description will be provided.

By way of summation and review, a driving voltage (power consumption) may be increased because resistance of an electrode increases as the metal is thinner. Thus, light emission efficiency and a driving voltage may have a trade-off relationship. In a bottom emissive display device, power consumption may also be reduced by reducing electrode resistance.

A secondary electrode may be used, and an auxiliary electrode may be formed together when a source, drain, or gate metal is formed, and various methods may be used to contact the secondary electrode and the auxiliary electrode. The potential for mass production may be determined according to the applicability of the method. For example, the organic light emitting display device may use a thin electrode having high transmittance, and accordingly resistance of the electrode may be increased. In addition, as the area of the emission portion is increased, the above-described effects may be more significant. Thus, a method for using an auxiliary electrode may be drawn out, but it may not be easy to connect the auxiliary electrode and a common electrode.

The embodiments may provide an organic light emitting display device in which an auxiliary electrode is formed in a non-display area and the auxiliary electrode is connected to a cathode of an organic emission portion using a magnetic particle, and a method for manufacturing the same, to help reduce resistance of the cathode.

The embodiments may provide an organic light emitting display device including an auxiliary electrode.

For example, in the organic light emitting display device and the manufacturing method thereof according to the exemplary embodiments, the auxiliary electrode may be formed in the non-display area and the auxiliary electrode may be connected to a cathode of the organic emission portion using the magnetic particle, and thereby resistance of the cathode may be reduced and the organic light emitting display device may be increased in size.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

| | |
|---|---|
| 10: dispenser | 20: organic material |
| 30: magnetic particle | 40, 90: semiconductor layer |
| 50: source electrode | 60: drain electrode |
| 70: gate electrode | 80: thin film transistor |
| 92: contact hole | 95: auxiliary electrode |
| 110: first electromagnet | 120: second electromagnet |
| 160: third electromagnet | 130: gate insulating layer |
| 140: interlayer insulating layer | 150: planarization layer |
| 200: organic light emitting element | 220: first electrode |
| 230: organic light emitting material | |
| 240: second electrode | |
| 310: pixel defining layer | |

What is claimed is:

1. A method for manufacturing an organic light emitting display device that includes a gate electrode, a source electrode, and a drain electrode in a display area of a display substrate, the method comprising:
    forming an auxiliary electrode in a non-display area of the display substrate;
    forming a first electrode that is electrically connected with the drain electrode and the auxiliary electrode;
    providing a magnetic particle on the first electrode in the non-display area of the display substrate, the magnetic particle being carried in an organic material;
    fixing the magnetic particle to the first electrode using a first electromagnet;
    removing the organic material;
    forming an organic light emitting material on the first electrode and the magnetic particle;
    removing the magnetic particle and the organic light emitting material formed on the magnetic particle using a second electromagnet provided at a distance from the magnetic particle; and
    forming a second electrode on the first electrode and the organic light emitting material.

2. The method for forming the organic light emitting display device as claimed in claim 1, wherein forming the second electrode includes directly contacting the second electrode with the first electrode in the non-display area.

3. The method for forming the organic light emitting display device as claimed in claim 1, wherein forming the auxiliary electrode includes forming the auxiliary electrode on a same layer as the gate electrode.

4. The method for forming the organic light emitting display device as claimed in claim 1, wherein forming the auxiliary electrode includes forming the auxiliary electrode on a same layer as the source electrode and the drain electrode.

5. The method for forming the organic light emitting display device as claimed in claim 1, wherein providing the magnetic particle includes supplying the magnetic particle on the first electrode by performing a one drop filling process or a printing process.

6. The method for manufacturing the organic light emitting display device as claimed in claim 1, wherein the magnetic particle has an amorphous shape, a circular shape, a cylindrical shape, a circular cylinder shape, an oval shape, a conical shape, or a polygonal shape.

7. The method for manufacturing the organic light emitting display device as claimed in claim 1, wherein providing the magnetic particle includes disposing the magnetic particle in one or two locations on the first electrode of the non-display area of the display substrate.

8. The method for manufacturing the organic light emitting display device as claimed in claim 1, wherein providing the magnetic particle includes disposing one or two magnetic particles on the first electrode.

9. The method for manufacturing the organic light emitting display device as claimed in claim 1, wherein the magnetic particle has a polarity.

10. The method for manufacturing the organic light emitting display device as claimed in claim 1, wherein the first electromagnet has a variable polarity.

11. The method for manufacturing the organic light emitting display device as claimed in claim 1, wherein the first electromagnet selectively applies a magnetic force.

12. The method for manufacturing the organic light emitting display device as claimed in claim 1, wherein the first electromagnet has a plate shape.

13. The method for manufacturing the organic light emitting display device as claimed in claim 1, wherein providing the magnetic particle includes moving the magnetic particle on the first electrode using a movable third electromagnet having a bar shape.

* * * * *